(12) United States Patent
Blankenship et al.

(10) Patent No.: US 6,785,863 B2
(45) Date of Patent: Aug. 31, 2004

(54) METHOD AND APPARATUS FOR GENERATING PARITY-CHECK BITS FROM A SYMBOL SET

(75) Inventors: Yufei Blankenship, Streamwood, IL (US); Brian Classon, Palatine, IL (US); Vipul Desai, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/246,065

(22) Filed: Sep. 18, 2002

(65) Prior Publication Data

US 2004/0054959 A1 Mar. 18, 2004

(51) Int. Cl.$^7$ ............................................... G06F 11/00
(52) U.S. Cl. ....................................................... 714/799
(58) Field of Search ................................ 714/799, 800, 714/801, 805, 803

(56) References Cited

U.S. PATENT DOCUMENTS

| | | | | |
|---|---|---|---|---|
| 4,939,733 A | * | 7/1990 | Furutani | 714/765 |
| 6,219,817 B1 | * | 4/2001 | Holman | 714/785 |
| 6,567,465 B2 | * | 5/2003 | Goldstein et al. | 375/222 |

OTHER PUBLICATIONS

Blansksby, A.J. & Howland, C.J. "A 690-m W 1-Gb/s 1024-b, Rate-1/2 Low-Density Parity-Check Code Decoder" IEEE Journal of Solid-State Circuits, vol. 37, No. 3, Mar. 2002.

Chung, Sae-Young; Forney, G. David Jr.; Richardson, Thomas J.; Urbanke, Rudiger. "On The Design of Low-Density Parity-Check Codes within 0.0045dB of the Shannon Limit" IEEE Communications Letters, vol. 5, No. 2, Feb. 2001.

Gallager, R.G. "Low-Density Parity-Check Codes" IRE Transactions on Information Theory, Jan. 1962. PP 21-28.

Hous, Jilei; Siegel, Paul H.; Milstein, Laurence B. "Performance Analysis and Code Optimization of Low Density Parity-Check Codes on Rayleigh Fading Channels" IEEE Journal of Selected Areas in Communications, vol. 10, No. 5 May 2001.

Ping, Li; Leung, W.K.; Phamdo, Nam. "Low Density Parity Check Codes With Semi-random Parity Check Matrix". Electronics Letters, Jan. 7, 1999, vol. 35 No. 1.

Mackay, David J.C.; Wilson, Simon T.; Davey, Matthew C. "Comparison of Constructions of Irregular Gallager Codes" Transactions Letters. IEEE Transaction of Communications vol. 47, No. 10, Oct. 1999.

Mackay, David JC. "Good Error-Correcting Codes Based on Very Sparse Matrices" IEEE Transactions on Information Theory, vol. 45 No. 2, Mar. 1999.

Richardson, Thomas J.; Shokrollahi, M. Amin; Urbanke, Rudiger L. "Design of Capacity-Approaching Irregular Low-Density Parity-Check Codes". IEEE Transactions On Information Theory vol. 47, No. 2, Feb. 2001.

Richardson Thomas J; Urbanke Rudiger L. "Efficient Encoding of Low Density Parity-Check Codes " IEEE Transactions On Information Theory vol. 47 No. 2, Feb. 2001.

(List continued on next page.)

Primary Examiner—Albert Decady
Assistant Examiner—Esaw Abraham
(74) Attorney, Agent, or Firm—Kenneth A. Haas

(57) ABSTRACT

The present invention encompasses a method for determining values for parity check bits ($p_1, \ldots, p_m$) based on a current symbol set ($s_1, \ldots, s_k$). The method comprises the steps of receiving the current symbol set ($s_1, \ldots, s_k$) and using a transformation of a matrix to determine the parity check bits. The first $N_2$ columns of the matrix is defined that for column i, $1 \leq i \leq \lfloor m/2 \rfloor$, a value of 1 is assigned to row position i and a value of 1 is assigned to row position $i+\lfloor m/2 \rfloor$, all other row positions have a value of 0. Additionally for column i, $\lfloor m/2 \rfloor+1 \leq i \leq N_2 < m$, a value of 1 is assigned to row position $i-\lfloor m/2 \rfloor$ and a value of 1 is assigned to row position i+1, all other row positions have a value of 0.

18 Claims, 1 Drawing Sheet

OTHER PUBLICATIONS

M. Luby, M. Mitzenmacher, A. Shokrollahi, D. Speilman, and V. Stemann, "Practical loss–resilient codes," in Proc. 29th Annu. ACM Symp. Theory of Computing, 1997, pp. 150–159. (Annual ACM Symposium on Theory of Computing).

M. Luby, M. Mitzenmacher, A. Shokrollahi, and D. Spielman, "Analysis of low density codes and improved designs using irregular graphs," in Proc. 30th Annu. ACM Symp. Theory of Computing, 1998, pp. 249–258. (Annual ACM Symposium on Theory of Computing).

* cited by examiner

100

METHOD AND APPARATUS FOR GENERATING PARITY-CHECK BITS FROM A SYMBOL SET

FIELD OF THE INVENTION

The present invention relates generally to encoding data and in particular, to a method and apparatus for encoding data utilizing low-density parity-check (LDPC) codes.

BACKGROUND OF THE INVENTION

An LDPC code is a linear block code specified by a parity-check matrix H. In general, an LDPC code is defined over a Galois Field GF(q), $q \geq 2$. If q=2, the code is a binary code. As with all linear block codes, a k-bit information block $S_{1 \times k}$ is generally encoded by the code generator matrix $G_{k \times n}$ to become an n-bit codeword $X_{1 \times n}$, and the code rate is r=k/n. The codeword x is transmitted through a noisy channel, and the received signal vector y is passed to the decoder to estimate the information block $s_{1 \times k}$.

Given an n-dimensional space, the rows of G span the k-dimensional codeword subspace C, and the rows of the parity-check matrix $H_{m \times n}$ span the m-dimensional dual space $C^{\perp}$, where m=n−k. Since x=sG and $GH^T$=0, it follows that $xH^T$=0 for all codewords in subspace C, where "T" denotes matrix transpose. In the discussion of LDPC codes, this is generally written as $$Hx^T = 0^T, \quad (1)$$

where 0 is a row vector of all zeros, and the codeword $x^T$ is:

$$x^T = \begin{bmatrix} p_1 \\ \vdots \\ p_{n-k} \\ s_1 \\ \vdots \\ s_k \end{bmatrix};$$

where, $p_1, \ldots p_{n-k}$ are the parity check bits; and $s_1, \ldots s_k$ are the systematic bits, equal to the information bits within the information block.

In order to use an LDPC code with good error-correcting performance, an appropriate low-density parity-check matrix H has to be defined. For most irregular LDPC codes, this requires making a large portion of the columns of H to be weight-2 (i.e., two ones in a column) in order to keep the overall density low (i.e., the overall matrix should be sparse). This large number of weight-2 columns can allow high weights (e.g., 30) to be assigned to some columns while still maintaining a low average column weight in H. (Note that the row weights are usually limited in range and are relatively small.)

Designing a parity-check matrix with various row and column weights is complicated when error performance is considered. For example, a matrix can be constructed with a series of randomly generated columns while satisfying the row weight and column weight constraints, however, with a large percentage of weight-2 columns in the matrix, randomly-generated weight-2 columns can easily contain a bad structure which induces an undetectable error event and a low minimum distance. In general, an undetectable error event of $N_{ud}$ bits could happen if $N_{ud}$ columns of the parity-check matrix sum (modulo 2) to the all-zero column. The all-zero column summation occurs with higher frequency when the parity-check matrix has a small size and contains weight-2 columns. The undetectable error event is directly linked to the minimum distance of the code which is equal to min($N_{ud}$). As a result, a randomly-generated parity-check matrix can have a small minimum distance, which causes a high probability of undetectable errors and an error floor at high signal-to-noise ratios. Furthermore, since code bits (elements of x) associated with weight-2 columns are much more prone to errors than code bits associated with higher-weight columns, a large percentage of undetectable frame errors is expected to involve weight-2 columns. Although there are several prior-art code construction guidelines cited or implied in literature such as (a) avoiding cycles of length 4 and (b) avoiding overlap between weight-2 columns when possible, these guidelines may not be sufficient for good error performance codes. Therefore, there is a need for deterministic distribution of weight-2 columns in which the occurrence of undetected frame errors is reduced in order to significantly enhance code performance in comparison to a randomly-constructed parity-check matrix.

Notwithstanding the above problem, another issue of LDPC codes is the high encoding complexity of the straightforward method using the generator matrix G corresponding to the H matrix defining the code. For a systematic LDPC encoder, parity check bit $p_i$, i=1, . . . , m, is generally computed from the given information bits, $s_1, \ldots, s_k$, m=n−k. Letting the codeword be x=[$p_1, \ldots, p_m, s_1, \ldots, s_k$], the parity check bits satisfy the parity-check equations of (1). A conventional encoding method transforms the parity-check matrix H into a systematic form $H_{sys}$=[$I_{m \times m}$, $P^T$] through Gaussian elimination and column reordering so that the corresponding code generator matrix is G=[$P_{k \times m}$, $I_{k \times k}$]. Therefore, the conventional encoder calculates the parity check bits using $$[p_1, \ldots, p_m] = [s_1, \ldots, s_k]P. \quad (2):$$

This straightforward method can cause implementation problems especially when the codeword size n is large. First, although H has low density (i.e., with a few 1's in the matrix and the number of 1's per row not growing with n), P and hence G usually have high density (i.e., many 1's in the matrix and the number of 1's per row increasing as n increases). Implementing the conventional encoder can require a large amount of memory to store the positions of the 1's in P. Secondly, due to the high density of P, the number of binary additions (only counting the terms when the elements of P are '1') is on the order of $n^2$; implying that the encoding complexity grows quadratically with n. Therefore, there is a need for an efficient encoder for irregular LDPC codes that takes advantage of the structure of a good performing irregular LDPC code to minimize preprocessing and admit a simple encoding program.

DETAILED DESCRIPTION OF THE DRAWINGS

To address the above-mentioned needs, a deterministic structure for controlled distribution of weight-2 columns is proposed that reduces the occurrence of undetected frame errors and significantly enhances the code performance in comparison to a randomly-constructed parity-check matrix.

The present invention encompasses a method for determining values for parity check bits $(p_1, \ldots, p_m)$ based on a current symbol set $(s_1, \ldots, s_k)$. The method comprises the steps of receiving the current symbol set $(s_1, \ldots, s_k)$ and using a transformation of a matrix to determine the parity check bits. In the preferred embodiment of the present invention the first $N_2$ columns of the matrix is defined by:

for column i, $1 \leq i \leq \lfloor m/2 \rfloor$, assign a value of 1 to row position i and a value of 1 to row position $i+\lfloor m/2 \rfloor$, all other row positions have a value of 0; and for column i, $\lfloor m/2 \rfloor+1 \leq i \leq N_2 < m$, assign a value of 1 to row position $i-\lfloor m/2 \rfloor$ and a value of 1 to row position $i+1$, all other row positions have a value of 0.

The present invention additionally encompasses an apparatus for determining values for parity check bits $(p_1, \ldots, p_m)$ based on a current symbol set $(s_1, \ldots, s_k)$. The apparatus comprises a database storing a transformation of a matrix and a microprocessor receiving the current symbol set $(s_1, \ldots, s_k)$ and using the transformation of the matrix to determine the parity check bits. In the preferred embodiment of the present invention, the matrix is defined by:

for column i, $1 \leq i \leq \lfloor m/2 \rfloor$, assign a value of 1 to row position i and a value of 1 to row position $i+\lfloor m/2 \rfloor$, all other row positions have a value of 0; and for column i, $\lfloor m/2 \rfloor+1 \leq i \leq N_2 < m$, assign a value of 1 to row position $i-\lfloor m/2 \rfloor$ and a value of 1 to row position $i+1$, all other row positions have a value of 0.

The present invention additionally encompasses a method for determining values for parity check bits $(p_1, \ldots, p_m)$ based on a current symbol set $(s_1, \ldots, s_k)$. The method comprises the steps of receiving the current symbol set $(s_1, \ldots, s_k)$, determining values for a first portion of the parity check bits wherein the first portion of parity check bits is computed using the current symbol set $(s_1, \ldots, s_k)$. Values for a second portion of the parity check bits are determined, wherein the second portion of parity check bits is computed using the current symbol set $(s_1, \ldots, s_k)$ and the first portion of parity check bits. Finally values for a third portion of the parity check bits are determined, wherein the third portion of parity check bits is computed using the current symbol set $(s_1, \ldots, s_k)$, the first portion of parity check bits, and a parity check bit not within the first portion of parity check bits.

Figure 1:
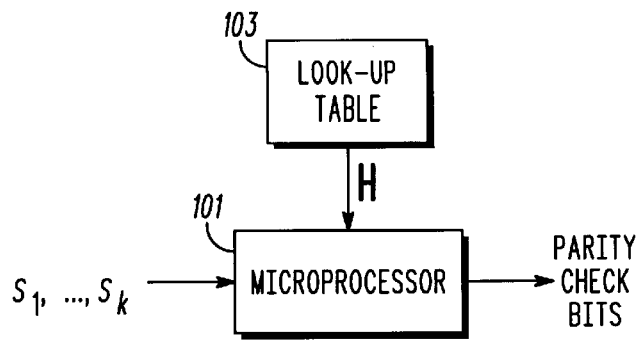
FIG. 1 is a block diagram of an encoder in accordance with the preferred embodiment of the present invention.

Turning now to the drawings, wherein like numerals designate like components, FIG. 1 is a block diagram of encoder 100 in accordance with the preferred embodiment of the present invention. As shown, encoder 100 comprises microprocessor 101 and lookup table 103. In the preferred embodiment of the present invention microprocessor 101 preferably comprises a digital signal processor (DSP), such as, but not limited to MSC8100 and DSP56300 DSPs. Additionally, in the preferred embodiment of the present invention lookup table 103 comprises read-only memory, however, one of ordinary skill in the art will recognize that other forms of memory (e.g., random-access memory, magnetic storage memory, ..., etc.) may be utilized as well.

As discussed above, encoded data is generally output as a plurality of parity check bits that are a solution to $Hx^T=0^T$ in addition to the systematic bits. In the preferred embodiment of the present invention the parity-check matrix is stored in memory 103, and is accessed by microprocessor 101 to solve the above equation. In particular, microprocessor 101 determines appropriate values for the parity check bits $(p_1, \ldots, p_m)$ based on the current symbol set $(s_1, \ldots, s_k)$ and the parity-check matrix H. In the preferred embodiment of the present invention H comprises a first and a second section, the first section being deterministic (i.e., the value of each entry is defined) in a particular manner and the second section being non-deterministic (i.e., the value of each entry can be random as long as certain design constraints are met).

The deterministic section is further composed of two parts. In particular, the first part comprises columns i, $1 \leq i \leq \lfloor m/2 \rfloor$, where a '1' is assigned to row position i and to row position $i+\lfloor m/2 \rfloor$, with all other row positions being '0'. This makes an $\lfloor m/2 \rfloor$-by-$\lfloor m/2 \rfloor$ identity matrix lie on top of another identity matrix of the same size. Here the floor function of variable x, $\lfloor x \rfloor$, is defined as the largest integer smaller than or equal to x. The second part of the deterministic section comprises columns i, $\lfloor m/2 \rfloor+1 \leq i \leq N_2 < m$, where a '1' is assigned to row position $i-\lfloor m/2 \rfloor$ and to row position $i+1$, with all other row positions being '0'. Here $N_2$ is the smaller value between m−1 and the number of weight-2 columns. This assignment essentially makes an identity matrix lie on top of a downshifted identity matrix.

As an example, for the case of m even and $m/2 < N_2 < m$, the parity-check matrix can be illustrated by $$H = \begin{bmatrix} I_{(m/2)\times(m/2)} & \begin{matrix} I_{(N_2-m/2)\times(N_2-m/2)} \\ 0_{(m-N_2)\times(N_2-m/2)} \end{matrix} & C_{(m/2)\times(n-N_2)} \\ I_{(m/2)\times(m/2)} & \begin{matrix} 0_{1\times(N_2-m/2)} \\ I_{(N_2-m/2)\times(N_2-m/2)} \\ 0_{(m-N_2-1)\times(N_2-m/2)} \end{matrix} & D_{(m/2)\times(n-N_2)} \end{bmatrix}, \quad (3)$$

where $I_{xxx}$ is an x-by-x identity matrix, $0_{xxy}$ is an x-by-y matrix of all zeros, and matrices C and D represent the non-deterministic section of the matrix. Specifically, C and D represent the columns with weight greater than 2. If more than $N_2$ weight-2 columns are needed in H, the extra weight-2 columns are included in C and D as well.

When m is odd and $\lfloor m/2 \rfloor < N_2 < m$, the parity-check matrix can be illustrated by:

$$H = \begin{bmatrix} I_{\lfloor m/2 \rfloor \times \lfloor m/2 \rfloor} & \begin{matrix} I_{(N_2-\lfloor m/2 \rfloor)\times(N_2-\lfloor m/2 \rfloor)} \\ 0_{(m-1-N_2)\times(N_2-\lfloor m/2 \rfloor)} \end{matrix} & C_{\lfloor m/2 \rfloor \times (n-N_2)} \\ \begin{matrix} I_{\lfloor m/2 \rfloor \times \lfloor m/2 \rfloor} \\ 0_{1\times \lfloor m/2 \rfloor} \end{matrix} & \begin{matrix} 0_{1\times(N_2-\lfloor m/2 \rfloor)} \\ I_{(N_2-\lfloor m/2 \rfloor)\times(N_2-\lfloor m/2 \rfloor)} \\ 0_{(m-N_2-1)\times(N_2-\lfloor m/2 \rfloor)} \end{matrix} & D_{(m+1)/2 \times (n-N_2)} \end{bmatrix}. \quad (4)$$

For simplicity, the following discussion will be given with reference to H where m is even ((3)), although one of ordinary skill in the art will recognize that the H of (4), where m is odd, can be utilized as well.

This deterministic structure (or its column/row permuted form) avoids cycles involving weight-2 columns alone and avoids introducing codewords of low weight. Although the structure was introduced as deterministic, it does not compromise any feature of good irregular parity-check matrices and is not considered a performance-limiting constraint.

A practical consideration in designing parity-check matrices is associating column weights of H with bits in the codeword x. In general, codeword bits associated with weight-2 columns have worse error probability performance than those associated with higher-weight columns. Due to this unequal error performance, weight-2 columns in H should be assigned to parity check bits when possible to enhance the performance of the code.

A row and/or column permuted version of (3) or (4) can be permuted to explicitly manifest the deterministic structure and allow efficient encoding. Additionally, any number of columns may be deleted from H without severely altering the performance of encoder 100. After encoding with the permuted matrix, the codeword bits are re-ordered, if necessary, to match the codeword produced had the original parity-check matrix been used.

In the preferred embodiment of the present invention H is transformed into an equivalent matrix $H_1$ to allow for efficient calculation of the parity check bits. In particular, the transformation of H can be summarized as follows:

Step 1: Add top half (rows 1 through $\lfloor m/2 \rfloor$) of H to the lower half of H. This addition removes the identity sub matrix residing on the lower left corner of H (from part 1 of the deterministic section).

Step 2: Add rows $\lfloor m/2 \rfloor+1$ through $N_2$ to row $N_2+1$. This addition removes the '1' at position ($N_2+1$, $N_2$), and therefore, the first $N_2$ entries of row $N_2+1$ are now zero. In terms of the parity-check equations, $p_1$ through $P_{N_2}$ are removed from the last ($m-N_2$) parity-check equations.

Step 3: Use Gaussian elimination to make the sub matrix A, the block from row ($N_2+1$) to m, and column ($N_2+1$) to m, into an identity matrix.

In the preferred embodiment of the present invention the parity check bits are determined from the equivalent equations:

$$H_1 x^T = 0^T. \tag{5}$$

Since H is sparse, $H_1$ is also sparse except the last ($m-N_2$) rows. In addition, the form of $H_1$ allows the encoding to be done efficiently, as shown later.

Although the encoding method described above is designed based upon the deterministic structure of parity-check matrix, it can also be used when H is row/column permuted. This is because row permutations of the parity-check matrix do not affect the code, while column permutations reorder the codeword bits.

Continuing with the parity-check matrix in (3), the result of the first transformation step is:

$$H = \begin{bmatrix} I_{(m/2) \times (m/2)} & \begin{array}{c} I_{(N_2-m/2) \times (N_2-m/2)} \\ 0_{(m-N_2) \times (N_2-m/2)} \end{array} & C \\ \hline 0_{(m/2) \times (m/2)} & \begin{array}{c} 1 \quad 0_{1 \times (N_2-m/2-1)} \\ (Z+I)_{(N_2-m/2) \times (N_2-m/2)} \\ 0_{(m-N_2-1) \times (N_2-m/2)} \end{array} & C+D \end{bmatrix}, \tag{6}$$

where Z is a $(N_2-m/2) \times (N_2-m/2)$ matrix with ones in position (i, i+1) for $i=1, \ldots, N_2-m/2-1$ and zeros elsewhere. The result of the second transformation step is:

$$H = \begin{bmatrix} I_{(m/2) \times (m/2)} & \begin{array}{c} I_{(N_2-m/2) \times (N_2-m/2)} \\ 0_{(m-N_2) \times (N_2-m/2)} \end{array} & C \\ \hline 0_{(m/2) \times (m/2)} & \begin{array}{c} (Z^T+I)_{(N_2-m/2) \times (N_2-m/2)} \\ 0_{(m-N_2) \times (N_2-m/2)} \end{array} & \begin{array}{c} (C+D)'_{(N_2-m/2) \times (n-N_2)} \\ Q_{1 \times (n-N_2)} \\ (C+D)''_{(m-N_2-1) \times (n-N_2)} \end{array} \end{bmatrix}, \tag{7}$$

where the matrix $(C+D)'$ represents the first $(N_2-m/2)$ rows of $(C+D)$ while $(C+D)''$ represents the last $(m-N_2-1)$ rows. The row vector Q is the resulting sum of the first $(N_2-m/2)$ rows and row $(N_2-m/2+1)$ of $(C+D)$. Before performing the third step, matrix in (7) is re-partitioned into $$H = \begin{bmatrix} I & \begin{array}{c} I \\ 0 \end{array} & \tilde{C}_{(m/2) \times (m-N_2)} & \hat{C}_{(m/2) \times (n-m)} \\ \hline 0 & (Z^T+I) & \begin{array}{c} (\tilde{C}+\tilde{D})'_{(N_2-m/2) \times (m-N_2)} \\ A_{(m-N_2) \times (m-N_2)} \end{array} & \begin{array}{c} (\hat{C}+\hat{D})'_{(N_2-m/2) \times (n-m)} \\ \hat{Q}_{1 \times (n-m)} \\ (\hat{C}+\hat{D})''_{(m-N_2-1) \times (n-m)} \end{array} \end{bmatrix}, \tag{8}$$

where the "^" represents the last (n−m) columns of the matrix and the "~" represents the first ($m-N_2$) columns. The Gaussian elimination on A (Step 3) then finally produces $H_1$:

$$H_1 = \begin{bmatrix} I & \begin{matrix} I \\ 0 \end{matrix} & \tilde{C} & \hat{C} \\ 0 & \begin{matrix} (Z^T+I) \\ 0 \end{matrix} & \begin{matrix} (\tilde{C}+\tilde{D})' \\ I_{(m-N_2)\times(m-N_2)} \end{matrix} & \begin{bmatrix} (\hat{C}+\hat{D})' \\ A^{-1}\begin{bmatrix} \hat{Q} \\ (\hat{C}+\hat{D})'' \end{bmatrix} \end{bmatrix} \end{bmatrix}. \quad (9)$$

For the first $\lfloor m/2 \rfloor$ rows, the row weights are preserved from H to $H_1$. In the next $(N_2-\lfloor m/2 \rfloor)$ rows, the row weights are at most doubled. The row weight may increase significantly in the last $(m-N_2)$ rows. Therefore, the matrix consisting of these rows of $H_1$ may be not sparse, in contrast to the usual representation of a low-density parity-check matrix. Alternative methods to find the last $(m-N_2)$ parity check bits are possible, such as applying the inverse of A during encoding instead of preprocessing so that the low row weight of the last $(m-N_2)$ rows is preserved. It is also worth noting that the transformed deterministic section, which is the two left hand sections of (9), does not form a triangular matrix. In fact, this portion of $H_1$ is constructed to be much more efficient for encoding than any standard linear algebra technique, as will be shown below.

As discussed above, permutations of $H_1$ can also be used with equal efficiency. More particularly a permutation of $H_1$ having any or no row interchanged, any or no column interchanged may be utilized by microprocessor 101 when computing parity check bits.

Figure 2:
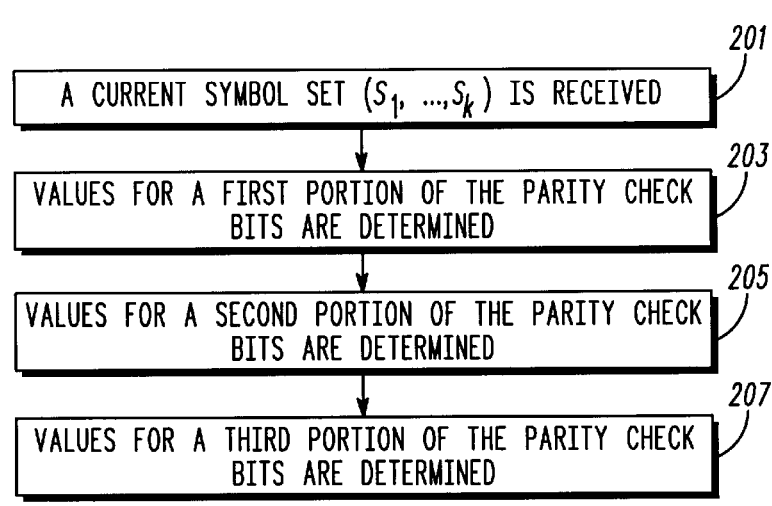
FIG. 2 is a flow chart showing the operation of the encoder of FIG. 1 in accordance with the preferred embodiment of the present invention.

Once the matrix $H_1$ is produced from preprocessing, processor 101 exploits the structure of $H_1$ to compute the m parity check bits based on (5). As shown in FIG. 2, processor 101 performs the following steps to obtain the parity check bits based on the current symbol set $(s_1, \ldots, s_k)$ and $H_1$ in (9):

The logic flow begins at step 201 where a current symbol set $(s_1, \ldots, s_k)$ is received. At step 203, values for a first portion of the parity check bits are determined, wherein the first portion of parity check bits is computed using the current symbol set $(s_1, \ldots, s_k)$. In particular, parity check bits $p_{N_2+1}$ through $p_m$ are obtained by:

$$p_i = \left( \sum_{j=m+1}^{n} h_1(i,j) s_{j-m} \right) \mod 2, \; i = N_2+1, \ldots, m, \quad (10)$$

where $h_1(i,j)$ represents the (i,j) entry of $H_1$. This step produces a first portion of parity check bits. The binary summation such as in (10) is also known as an inner product, with the inner product between the current symbol set $(s_1, \ldots, s_k)$, with m=n-k, and a part of a row of $H_1$. Since inner products are the fundamental unit of a matrix multiplication operation, producing the first portion of parity check bits can be viewed as the multiplication of the current symbol set $(s_1, \ldots, s_k)$ with a matrix, where the matrix is the non-sparse sub matrix of $H_1$ (bottom right of (9)). In GF(2), the inner product can be represented as a summation (addition) of selected terms. The GF(2) summation can also be referred to as a binary summation. Since there are at most k terms in the binary summation in (10), the resulting complexity of all $(m-N_2)$ parity bits is at most $(m-N_2) \times k$ GF(2) additions. Note that in general, $N_2$ is approximately equal to m, thereby, the complexity of this step is low.

Continuing, at step 205 values for a second portion of the parity check bits are determined where the second portion of parity check bits is computed using the current symbol set $(s_1, \ldots, s_k)$ and the first portion of parity check bits. In particular, parity check bits $P_{N_2-\lfloor m/2 \rfloor+1}$ through $P_{\lfloor m/2 \rfloor+1}$ are obtained by $$p_i = \left( \sum_{j=N_2+1}^{m} h_1(i,j) p_j + \sum_{j=m+1}^{n} h_1(i,j) s_{j-m} \right) \mod 2, \quad (11)$$

$$i = N_2 - \lfloor m/2 \rfloor + 1, \ldots, \lfloor m/2 \rfloor + 1.$$

Step 205 determines the values for a second portion of the parity check bits, where the second portion of parity check bits is computed using the current symbol set $(s_1, \ldots, s_k)$ and the first portion of parity check bits by performing an inner product with the current symbol set $(s_1, \ldots, s_k)$ and the first portion of parity check bits. Note that the inner product is expressed with two inner products. Since $H_1$ is sparse with many $h_1(i,j)$ terms being 0, there are at most $(d_{c,max}-1)$ terms in the binary summation in (11), except for $i=\lfloor m/2 \rfloor+1$, which has at most $(2d_{c,max}-3)$ terms. Here $d_{c,max}$ is the maximum row weight of H, and usually $d_{c,max}<10$. Since most $h_1(i,j)=0$, the encoder would only need to know the locations where $h_1(i,j)=1$.

At step 207 values for a third portion of the parity check bits are determined, where the third portion of parity check bits is computed using the current symbol set $(s_1, \ldots, s_k)$, the first portion of parity check bits, and a parity check bit not within the first portion of parity check bits. In particular, parity check bits $p_{\lfloor m/2 \rfloor+2}$ through $P_{N_2}$ are obtained by:

$$p_i = \left( p_{i-1} + \sum_{j=N_2+1}^{m} h_1(i,j) p_j + \sum_{j=m+1}^{n} h_1(i,j) s_{j-m} \right) \mod 2, \quad (12)$$

$$i = \lfloor m/2 \rfloor + 2, \ldots, N_2.$$

Thus, at step 207 the values for a third portion of the parity check bits are determined, where the third portion of parity check bits is computed using the current symbol set $(s_1, \ldots, s_k)$ and the first portion of parity check bits from Step 2, via an inner product, and exactly one parity check bit not within the first portion of parity check bits. Since at most $2(d_{c,max}-1)$ entries of the $i^{th}$ row of $H_1$ are non-zero, there are at most $(2d_{c,max}-3)$ terms in the binary summation in (12).

At step 207 parity check bit $p_1$ through $P_{N_2-\lfloor m/2 \rfloor}$ can be obtained by:

$$p_i = \left( p_{\lfloor m/2 \rfloor+i} + \sum_{j=N_2+1}^{m} h_1(i,j) p_j + \sum_{j=m+1}^{n} h_1(i,j) s_{j-m} \right) \mod 2, \quad (13)$$

$$i = 1, \ldots, N_2 - \lfloor m/2 \rfloor.$$

Step 207 determines the values for a third portion of the parity check bits, where the third portion of parity check bits is computed using the current symbol set $(s_1, \ldots, s_k)$ and the first portion of parity check bits from Step 2, via an inner product, and exactly one parity check bit not within the first portion of parity check bits. Since at most $d_{c,max}$ entries of the $i^{th}$ row of $H_1$ are non-zero, there are at most $(d_{c,max}-1)$ terms in the binary summation in (13).

Thus, when the number of weight-2 columns $N_2$ is close to m, almost all parity check bits can be obtained by a linear summation of a few binary terms. The encoding complexity is roughly on the order of n instead of $n^2$. For the codes with degree distribution tabulated in T. Richardson, A. Shokrollahi, and R. Urbanke, "Design of capacity-approaching irregular low-density parity-check codes,"

IEEE Trans. Inform. Theory, vol. 47, no. 2, pp. 619–637, February 2001, and J. Hou, P. H. Siegel, and L. B. Milstein, "Performance analysis and code optimization of low density parity-check codes on Rayleigh fading channels," IEEE J. Select. Areas Commun., vol. 19, pp. 924–934, May 2001, this procedure reduces the encoding complexity significantly, especially when n is large. Also, in contrast to storing a high-density code generator in encoder 100, as is the case using a code generator computed from the conventional Gaussian-elimination method, the preferred embodiment of the present invention only requires the storage of a low-density $H_1$ for the encoder. The savings in terms of memory is significant when n is large.

The transformation and the calculation of the parity check bits are based on the deterministic structure. If only a subset of columns in the deterministic structure is selected, the general principle of the encoding method can still be applied, but the steps may need to be modified slightly. For example, Step 2 in the transformation may need to be modified to make the first $N_2$ entries of the last $(m-N_2)$ rows to be zero through extra row additions. Accordingly, the A matrix in Step 3 and the parity check bits calculation may need to be changed.

The following text is for example purposes. It illustrates the construction of the deterministic section, describes the transformation of H to $H_1$, and shows the subsequent determination of the parity check bits.

For a rate-½ code with a parity-check matrix having m=8 rows and $N_2$=6 weight-2 columns, the parity-check equations have the form:

$$\begin{bmatrix} 1 & 0 & 0 & 0 & | & 1 & 0 & & \cdots & & \cdots & \\ 0 & 1 & 0 & 0 & | & 0 & 1 & & \cdots & & \cdots & \\ 0 & 0 & 1 & 0 & | & 0 & 0 & & \cdots & & \cdots & \\ 0 & 0 & 0 & 1 & | & 0 & 0 & & \cdots & & \cdots & \\ \hline 1 & 0 & 0 & 0 & | & 0 & 0 & & \cdots & & \cdots & \\ 0 & 1 & 0 & 0 & | & 1 & 0 & & \cdots & & \cdots & \\ 0 & 0 & 1 & 0 & | & 0 & 1 & & \cdots & & \cdots & \\ 0 & 0 & 0 & 1 & | & 0 & 0 & & \cdots & & \cdots & \\ & & & & & \underline{2} & \underline{8} & & & & & \end{bmatrix} \times \begin{bmatrix} p_1 \\ \vdots \\ p_8 \\ s_1 \\ \vdots \\ s_8 \end{bmatrix} = 0^T, \quad (14)$$

where $p_1, \ldots, p_8$ are the parity check bits, and $s_1, \ldots, s_8$ are the systematic (information) bits (i.e., comprises the current symbol set). The dashed lines indicate the parts of the deterministic section. After the row additions, H becomes:

$$\begin{bmatrix} 1 & 0 & 0 & 0 & | & 1 & 0 & & \cdots & & \cdots & \\ 0 & 1 & 0 & 0 & | & 0 & 1 & & \cdots & & \cdots & \\ 0 & 0 & 1 & 0 & | & 0 & 0 & & \cdots & & \cdots & \\ 0 & 0 & 0 & 1 & | & 0 & 0 & & \cdots & & \cdots & \\ \hline 0 & 0 & 0 & 0 & | & 1 & 0 & & \cdots & & \cdots & \\ 0 & 0 & 0 & 0 & | & 1 & 1 & & \cdots & & \cdots & \\ 0 & 0 & 0 & 0 & | & 0 & 0 & & & & \\ 0 & 0 & 0 & 0 & | & 0 & 0 & A_{2\times 2} & & B_{2\times 8} & & \end{bmatrix}. \quad (15)$$

After converting $A_{2\times 2}$ to an identity matrix, the equivalent parity-check equations are:

$$H_1 x^T = \begin{bmatrix} 1 & 0 & 0 & 0 & | & 1 & 0 & & \cdots & & \cdots & \\ 0 & 1 & 0 & 0 & | & 0 & 1 & & \cdots & & \cdots & \\ 0 & 0 & 1 & 0 & | & 0 & 0 & & \cdots & & \cdots & \\ 0 & 0 & 0 & 1 & | & 0 & 0 & & \cdots & & \cdots & \\ \hline 0 & 0 & 0 & 0 & | & 1 & 0 & & \cdots & & \cdots & \\ 0 & 0 & 0 & 0 & | & 1 & 1 & & \cdots & & \cdots & \\ 0 & 0 & 0 & 0 & | & 0 & 0 & \overline{1} & 0 & B'_{2\times 8} & \\ 0 & 0 & 0 & 0 & | & 0 & 0 & 0 & 1 & & \end{bmatrix} \times \begin{bmatrix} p_1 \\ \vdots \\ p_8 \\ s_1 \\ \vdots \\ s_8 \end{bmatrix} = 0^T. \quad (16)$$

After the Gaussian elimination on A, $B'=A^{-1}B$ may have high density but the rest of $H_1$ has low density.

Encoding:

Parity check bits $p_7$ and $p_8$ can be obtained by:

$$p_i = \left( \sum_{j=1}^{8} b'(i-6, j) s_j \right) \bmod 2, \; i = 7, 8, \quad (17)$$

where b'(i) is the $i^{th}$ element of B'. The rest of the parity check bits, $p_1$ through $p_6$, can be obtained by summing a small number of binary terms in the following equations:

$$p_i = \left( \sum_{j=7}^{8} h_1(i,j) p_j + \sum_{j=9}^{16} h_1(i,j) s_{j-8} \right) \bmod 2, \; i = 3, 4, 5. \quad (18)$$

$$p_6 = \left( p_5 + \sum_{j=7}^{8} h_1(i,j) p_j + \sum_{j=9}^{16} h_1(i,j) s_{j-8} \right) \bmod 2, \; i = 6. \quad (19)$$

$$p_i = \left( p_{4+i} + \sum_{j=7}^{8} h_1(i,j) p_j + \sum_{j=9}^{16} h_1(i,j) s_{j-8} \right) \bmod 2, \quad (20)$$

$i = 1, 2.$

Therefore, a first ($p_7$, $p_8$), second ($p_3$, $p_4$, $p_5$), and third ($p_6$, $p_1$, $p_2$) portion of parity check bits have been produced.

Figure 3:
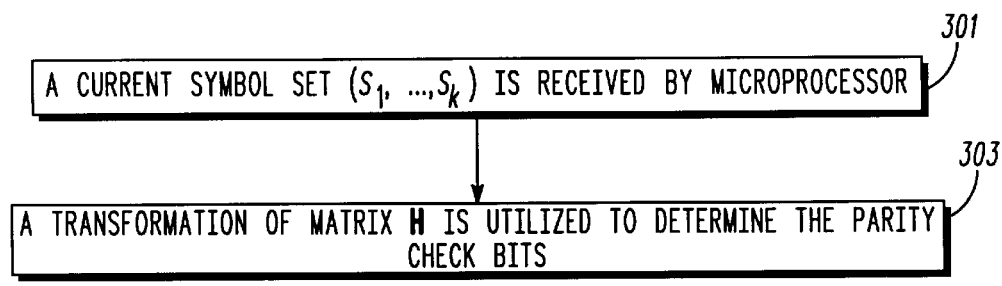
FIG. 3 is a flow chart showing operation of the encoder of FIG. 1 in accordance with the preferred embodiment of the present invention.

FIG. 3 is a flow chart detailing the operation of encoder of FIG. 1 in accordance with the preferred embodiment of the present invention. The logic flow begins at step 301 where a current symbol set ($s_1, \ldots, s_k$) is received by microprocessor 101. As discussed above, microprocessor 101 solves $Hx^T = 0^T$ to output the parity check bits ($p_1, \ldots, p_m$). In particular, the parity check bits comprise a portion of $x^T$, where:

$$x^T = \begin{bmatrix} p_1 \\ \vdots \\ p_{n-k} \\ s_1 \\ \vdots \\ s_k \end{bmatrix}.$$

At step 303, a transformation $H_1$ of matrix H is utilized to determine the parity check bits. In particular, $H_1$ is utilized by microprocessor 101 to determine the parity check bits.

While the invention has been particularly shown and described with reference to a particular embodiment, it will be understood by those skilled in the art that various changes in form and details may be made therein without departing from the spirit and scope of the invention. For example, while the invention has been shown with the ordering of $s_i$ and $p_i$ within x defined, one of ordinary skill in the art will recognize that other ordering of the bits within x can occur since the codeword bits can be collected in any order as long as the rows of H are reordered accordingly. Additionally, while the above-description has been particularly shown and described with reference to binary codes GF(2), one of ordinary skill in the art will recognize that an arbitrary GF may be utilized as well. It is intended that such changes come within the scope of the following claims.

What is claimed is:

1. A method for operating a transmitter that generates parity check bits $(p_1, \ldots, p_m)$ based on a current symbol set $(s_1, \ldots, s_k)$, the method comprising the steps of:
   receiving the current symbol set $(s_1, \ldots, s_k)$;
   using a transformation of a matrix to determine the parity check bits, wherein the first $N_2$ columns of the matrix is defined by:
   a deterministic section with N2 columns of weight-2;
   for column i, $1 \leq i \leq \lfloor m/2 \rfloor$, assign a value of 1 to row position i and a value of 1 to row position $i+\lfloor m/2 \rfloor$, all other row positions have a value of 0;
   for column i, $\lfloor m/2 \rfloor+1 \leq i \leq N_2 < m$, assign a value of 1 to row position $i-\lfloor m/2 \rfloor$ and a value of 1 to row position $i+1$, all other row positions have a value of 0;
   a non-deterministic section with most columns of weight greater than or equal to 2;
   transmitting the parity check bits along with the current symbol set; and wherein the matrix is equal to:

$$\left[ \begin{array}{c|c|c} I_{(m/2)\times(m/2)} & \begin{array}{c} I_{(N_2-m/2)\times(N_2-m/2)} \\ 0_{(m-N_2)\times(N_2-m/2)} \end{array} & C_{(m/2)\times(n-N_2)} \\ \hline & 0_{1\times(N_2-m/2)} & \\ I_{(m/2)\times(m/2)} & I_{(N_2-m/2)\times(N_2-m/2)} & D_{(m/2)\times(n-N_2)} \\ & 0_{(m-N_2-1)\times(N_2-m/2)} & \end{array} \right] \text{ or}$$

$$\left[ \begin{array}{c|c|c} I_{\lfloor m/2 \rfloor \times \lfloor m/2 \rfloor} & \begin{array}{c} I_{(N_2-\lfloor m/2 \rfloor)\times(N_2-\lfloor m/2 \rfloor)} \\ 0_{(m-1-N_2)\times(N_2-\lfloor m/2 \rfloor)} \end{array} & C_{\lfloor m/2 \rfloor \times(n-N_2)} \\ \hline I_{\lfloor m/2 \rfloor \times \lfloor m/2 \rfloor} & 0_{1\times(N_2-\lfloor m/2 \rfloor)} & \\ 0_{1\times\lfloor m/2 \rfloor} & I_{(N_2-\lfloor m/2 \rfloor)\times(N_2-\lfloor m/2 \rfloor)} & D_{(m+1)/2\times(n-N_2)} \\ & 0_{(m-N_2-1)\times(N_2-\lfloor m/2 \rfloor)} & \end{array} \right]$$

wherein C and D comprise a non-deterministic section of the matrix.

2. The method of claim 1 wherein the step of using the transformation of the matrix comprises the step of using a transformed matrix which is obtained from the matrix having any or no row interchanged, any or no column interchanged, or any or no column deleted.

3. The method of claim 1 wherein the step of using the transformation of the matrix comprises the step of using a transformed matrix equal to:

$$\left[ \begin{array}{c|c|c|c} I & I & \tilde{C} & \hat{C} \\ & 0 & & \\ \hline & (Z^T+I) & (\tilde{C}+\tilde{D})' & (\hat{C}+\hat{D})' \\ 0 & 0 & I_{(m-N_2)\times(m-N_2)} & A^{-1}\left[ \begin{array}{c} \hat{Q} \\ (\hat{C}+\hat{D})'' \end{array} \right] \end{array} \right],$$

wherein Z is a $(N_2-\lfloor m/2 \rfloor) \square (N_2-\lfloor m/2 \rfloor)$ matrix with ones in position (i, i+1) for $i=1, \ldots, N_2-\lfloor m/2 \rfloor-1$ and zeros elsewhere.

4. An apparatus for determining values for parity check bits $(p_1, \ldots, p_m)$ based on a current symbol set $(s_1, \ldots, s_k)$, the apparatus comprising:

a database storing a transformation of a matrix; and a microprocessor receiving the current symbol set $(s_1, \ldots, s_k)$ and using the transformation of the matrix to determine the parity check bits, wherein the matrix is defined by:
   a deterministic section with N2 columns of weight-2;
   for column i, $1 \leq i \leq \lfloor m/2 \rfloor$, assign a value of 1 to row position i and a value of 1 to row position $i+\lfloor m/2 \rfloor$, all other row positions have a value of 0; and
   for column i, $\lfloor m/2 \rfloor+1 \leq i \leq N_2 < m$, assign a value of 1 to row position $i-\lfloor m/2 \rfloor$ and a value of 1 to row position $i+1$, all other row positions have a value of 0; and;
   a non-deterministic section with most columns of weight greater than or equal to 2; and wherein the matrix is equal to:

$$\left[ \begin{array}{c|c|c} I_{(m/2)\times(m/2)} & \begin{array}{c} I_{(N_2-m/2)\times(N_2-m/2)} \\ 0_{(m-N_2)\times(N_2-m/2)} \end{array} & C_{(m/2)\times(n-N_2)} \\ \hline & 0_{1\times(N_2-m/2)} & \\ I_{(m/2)\times(m/2)} & I_{(N_2-m/2)\times(N_2-m/2)} & D_{(m/2)\times(n-N_2)} \\ & 0_{(m-N_2-1)\times(N_2-m/2)} & \end{array} \right] \text{ or}$$

$$\left[ \begin{array}{c|c|c} I_{\lfloor m/2 \rfloor \times \lfloor m/2 \rfloor} & \begin{array}{c} I_{(N_2-\lfloor m/2 \rfloor)\times(N_2-\lfloor m/2 \rfloor)} \\ 0_{(m-1-N_2)\times(N_2-\lfloor m/2 \rfloor)} \end{array} & C_{\lfloor m/2 \rfloor \times(n-N_2)} \\ \hline I_{\lfloor m/2 \rfloor \times \lfloor m/2 \rfloor} & 0_{1\times(N_2-\lfloor m/2 \rfloor)} & \\ 0_{1\times\lfloor m/2 \rfloor} & I_{(N_2-\lfloor m/2 \rfloor)\times(N_2-\lfloor m/2 \rfloor)} & D_{(m+1)/2\times(n-N_2)} \\ & 0_{(m-N_2-1)\times(N_2-\lfloor m/2 \rfloor)} & \end{array} \right]$$

where C and D comprise a non-deterministic section of the matrix.

5. The apparatus of claim 4 wherein the transformation of the matrix is obtained from the matrix having any or no row interchanged, any or no column interchanged, or any or no column deleted.

6. The apparatus of claim 4 wherein the transformation of the matrix is equal to:

$$\left[ \begin{array}{c|c|c|c} I & I & \tilde{C} & \hat{C} \\ & 0 & & \\ \hline & (Z^T+I) & (\tilde{C}+\tilde{D})' & (\hat{C}+\hat{D})' \\ 0 & 0 & I_{(m-N_2)\times(m-N_2)} & A^{-1}\left[ \begin{array}{c} \hat{Q} \\ (\hat{C}+\hat{D})'' \end{array} \right] \end{array} \right],$$

wherein Z is a $(N_2-\lfloor m/2 \rfloor) \square (N_2-\lfloor m/2 \rfloor)$ matrix with ones in position (i,i+1) for $i=1, \ldots, N_2-\lfloor m/2 \rfloor-1$ and zeros elsewhere.

7. The apparatus of claim 4 wherein the microprocessor obtains the parity check bits $p_{N_2+1}$ through $p_m$ by the following equation:

$$p_i = \left( \sum_{j=m+1}^{n} h_1(i,j) s_{j-m} \right) \bmod 2, \; i = N_2+1, \ldots, m.$$

8. The apparatus of claim 4 wherein the microprocessor obtains the parity check bits $p_{N_2-\lfloor m/2 \rfloor+1}$ through $p_{\lfloor m/2 \rfloor+1}$ by the following equation:

$$p_i = \left( \sum_{j=N_2+1}^{m} h_1(i,j)p_j + \sum_{j=m+1}^{n} h_1(i,j)s_{j-m} \right) \bmod 2,$$

$$i = N_2 - \lfloor m/2 \rfloor + 1, \ldots, \lfloor m/2 \rfloor + 1.$$

9. The apparatus of claim 4 wherein the microprocessor obtains the parity check bits $p_{\lfloor m/2 \rfloor+2}$ through $p_{N_2}$ by the following equation:

$$p_i = \left( p_{i-1} + \sum_{j=N_2+1}^{m} h_1(i,j)p_j + \sum_{j=m+1}^{n} h_1(i,j)s_{j-m} \right) \bmod 2,$$

$$i = \lfloor m/2 \rfloor + 2, \ldots, N_2.$$

10. The apparatus of claim 4 wherein the microprocessor obtains the parity check bits $p_1$ through $p_{N_2-\lfloor m/2 \rfloor}$ by the following equation:

$$p_i = \left( p_{\lfloor m/2 \rfloor+i} + \sum_{j=N_2+1}^{m} h_1(i,j)p_j + \sum_{j=m+1}^{n} h_1(i,j)s_{j-m} \right) \bmod 2,$$

$$i = 1, \ldots, N_2 - \lfloor m/2 \rfloor.$$

11. A method for determining values for parity check bits $(p_1, \ldots, p_m)$ based on a current symbol set $(s_1, \ldots, s_k)$, the method comprising the steps of:

receiving the current symbol set $(s_1, \ldots, s_k)$;

determining values for a first portion of the parity check bits, wherein the first portion of parity check bits is computed using the current symbol set $(s_1, \ldots, s_k)$;

determining values for a second portion of the parity check bits, wherein the second portion of parity check bits is computed using the current symbol set $(s_1, \ldots, s_k)$ and the first portion of parity check bits;

determining values for a third portion of the parity check bits, wherein the third portion of parity check bits is computed using the current symbol set $(s_1, \ldots, s_k)$, the first portion of parity check bits, and a parity check bit not within the first portion of parity check bits; and transmitting the parity check bits along with the current symbol set.

12. The method of claim 11 wherein the step of determining the values for the first portion of parity check bits comprises the step of multiplication of the current symbol set $(s_1, \ldots, s_k)$ with a matrix.

13. The method of claim 12 wherein the step of multiplication of the current symbol set $(s_1, \ldots, s_k)$ with a matrix produces parity check bits $p_{N_2+1}$ through $p_m$ by the following equation:

$$p_i = \left( \sum_{j=m+1}^{n} h_1(i,j)s_{j-m} \right) \bmod 2, \ i = N_2+1, \ldots, m.$$

14. The method of claim 11 wherein the step of determining the values for the second portion of parity check bits comprises the step of performing an inner product with the current symbol set $(s_1, \ldots, s_k)$ and the first portion of parity check bits.

15. The method of claim 14 wherein the step of performing an inner product with the current symbol set $(s_1, \ldots, s_k)$ and the first portion of parity check bits produces parity check bits $p_{N_1-\lfloor m/2 \rfloor+1}$ through $p_{\lfloor m/2 \rfloor+1}$ by the following equation:

$$p_i = \left( \sum_{j=N_2+1}^{m} h_1(i,j)p_j + \sum_{j=m+1}^{n} h_1(i,j)s_{j-m} \right) \bmod 2,$$

$$i = N_2 - \lfloor m/2 \rfloor + 1, \ldots, \lfloor m/2 \rfloor + 1.$$

16. The method of claim 11 wherein the step of determining the values for the third portion of parity check bits comprises the step of performing an inner product with the current symbol set $(s_1, \ldots, s_k)$ and the first portion of parity check bits.

17. The method of claim 16 wherein the step of performing an inner product with the current symbol set $(s_1, \ldots, s_k)$ and the first portion of parity check bits produces parity check bits $p_{\lfloor m/2 \rfloor+2}$ through $p_{N_2}$ by the following equation:

$$p_i = \left( p_{i-1} + \sum_{j=N_2+1}^{m} h_1(i,j)p_j + \sum_{j=m+1}^{n} h_1(i,j)s_{j-m} \right) \bmod 2,$$

$$i = \lfloor m/2 \rfloor + 2, \ldots, N_2.$$

18. The method of claim 16 wherein the step of performing an inner product with the current symbol set $(s_1, \ldots, s_k)$ and the first portion of parity check bits produces parity check bits $p_1$ through $p_{N_2-\lfloor m/2 \rfloor}$ by the following equation:

$$p_i = \left( p_{\lfloor m/2 \rfloor+i} + \sum_{j=N_2+1}^{m} h_1(i,j)p_j + \sum_{j=m+1}^{n} h_1(i,j)s_{j-m} \right) \bmod 2,$$

$$i = 1, \ldots, N_2 - \lfloor m/2 \rfloor.$$

* * * * *